(12) United States Patent
Oh (10) Patent No.: US 6,314,537 B1
(45) Date of Patent: Nov. 6, 2001

(54) COMMAND GENERATOR HAVING SINGLE-INPUT TO MULTI-OUTPUT CONVERTER

(75) Inventor: Young-Nam Oh, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/428,654

(22) Filed: Oct. 28, 1999

(30) Foreign Application Priority Data

Oct. 28, 1998 (KR) .................................................. 98-45300

(51) Int. Cl.⁷ .................................................. G11C 29/00
(52) U.S. Cl. ............................................ 714/718; 714/812
(58) Field of Search ..................................... 714/812, 718

(56) References Cited

U.S. PATENT DOCUMENTS 4,086,625 * 4/1978 Garnier et al. ........................ 364/139

* cited by examiner

Primary Examiner—Phung M. Chung
(74) Attorney, Agent, or Firm—Jacobson Holman, PLLC (57) ABSTRACT

A command generator having a single-input multi-out converter is provided. The command generator in a memory device comprises a converter for receiving first and second control signals from external circuit and an input signal having a plurality of pulses to generate binary data denoting a command. The converter comprises an input buffer, in response to the first and the second control signals, for receiving the input signal having a plurality of pulses and outputting an output signal having a number of pulses within a predetermined period; and a pulse counter for counting the number of pulses in the output signal to generate binary data representing the counted number. The command generator counts the number of pulses of a input signal through a pad, that is, performs built-in self-test of the product, thereby product cost can be considerably reduced because of reduction of test time.

20 Claims, 5 Drawing Sheets

COMMAND GENERATOR HAVING SINGLE-INPUT TO MULTI-OUTPUT CONVERTER

BACKGROUND OF THE INVENTION

1. Field of the Invention

The present invention relates to a semiconductor memory, device; and, more particularly, to a command generator having a single-input to multi-output converter in a semiconductor memory device.

2. Prior Art of the Invention

Semiconductor memory devices, in particular, Dynamic Random Access Memories(DRAMs) have a higher degree of integration than the other components. Therefore, giga-bit level high integration memories can be implemented. The degree of integration will be, expected to be higher with advance of CMOS processing.

On the other hand, as the degree of integration becomes higher, the memory devices should implement special modes according to a demand of a system or JEDEC (Joint Electron Device Engineering Council) standard. In other words, a function, which is not need in a memory device having a lower degree of integration, is possible to be necessarily needed according to a demand of a microprocessor in a memory device having a higher degree of integration.

In a prior art, in order to implement the special modes, a high voltage having a predetermined level is applied to pins of a chip, or an additional logic circuit for implementing the special mode should be designed in the chip, thereby entering the special mode.

However, high voltage applied to the pins of the chip can give rise to mis-operation of the chip. On the other hand, the additional logic circuit gives rise to complications in a chip design. Also, a lot of control signals for generating a plurality of commands should be generated when the additional logic circuit is necessarily needed.

SUMMARY OF THE INVENTION

Therefore, it is an object of the present invention to provide a command generator having a single-input to multi-output converter.

It is another object of the present invention to provide a command generator which generates commands without a high, voltage applied from outside to thereby preventing circuits of a chip from mis-operation.

In accordance with one embodiment of the present invention, there is provided a command generator in a memory device, comprising: a converter for receiving first and second control signals from external circuit and an input signal having a plurality of pulses to generate binary data denoting a command, the converter, comprising: an input buffer, in response to the first and the second control signals, for receiving the input signal having a plurality of pulses and outputting an output signal having a number of pulses within a predetermined period, and a pulse counter for counting the number of pulses in the output signal to generate binary data representing the counted number.

In accordance with another embodiment of the present invention, there is provided a command generator in a memory device, comprising: a converter for receiving first and second control signals from external circuit and an input signal for test of the memory device, the input signal having a plurality of pulses to generate binary data denoting a command; a input detector for receiving binary input signals for normal operation and for outputting binary data denoting a command; and a mode command generator for outputting a command responsive to the binary data from the converter and the input detector.

In accordance with further another embodiment of the present invention, there is provided a memory device, comprising: a command generator in a memory device, including: a converter for receiving first and second control signals from external circuit and an input signal for test of the memory device, the input signal having a plurality of pulses to generate binary data denoting a command; a input detector for receiving binary input signals for normal operation and for outputting binary data denoting a command, and a mode command generator for outputting a command to set an operation mode for a circuit responsive to the binary data from the converter and the input detector.

BRIEF DESCRIPTION OF THE DRAWINGS

Other object and aspects of the invention will become more apparent from the following description of the embodiments with reference to the accompanying drawings in which.

DETAILED DESCRIPTION OF THE PREFERRED EMBODIMENTS

Preferred embodiments of the present invention will be explained with reference to the drawings.

In a single-input multi-out converter in accordance with the present invention, a lot of commands used for built-in-self-test (BIST) can be generated or operation modes for a circuit can be set according to binary outputs. That is, the single-input multi-out converter generates binary data denoting a command used for built-in-self-test.

Hereinafter, in order to show a clear embodiment of the single-input to multi-output converter, a case will be explained that the organization of a memory device is changed for test. An exemplary case will be explained where X4, X8, X16 and X32 have already been installed in the memory device as a bond option.

Figure 1:
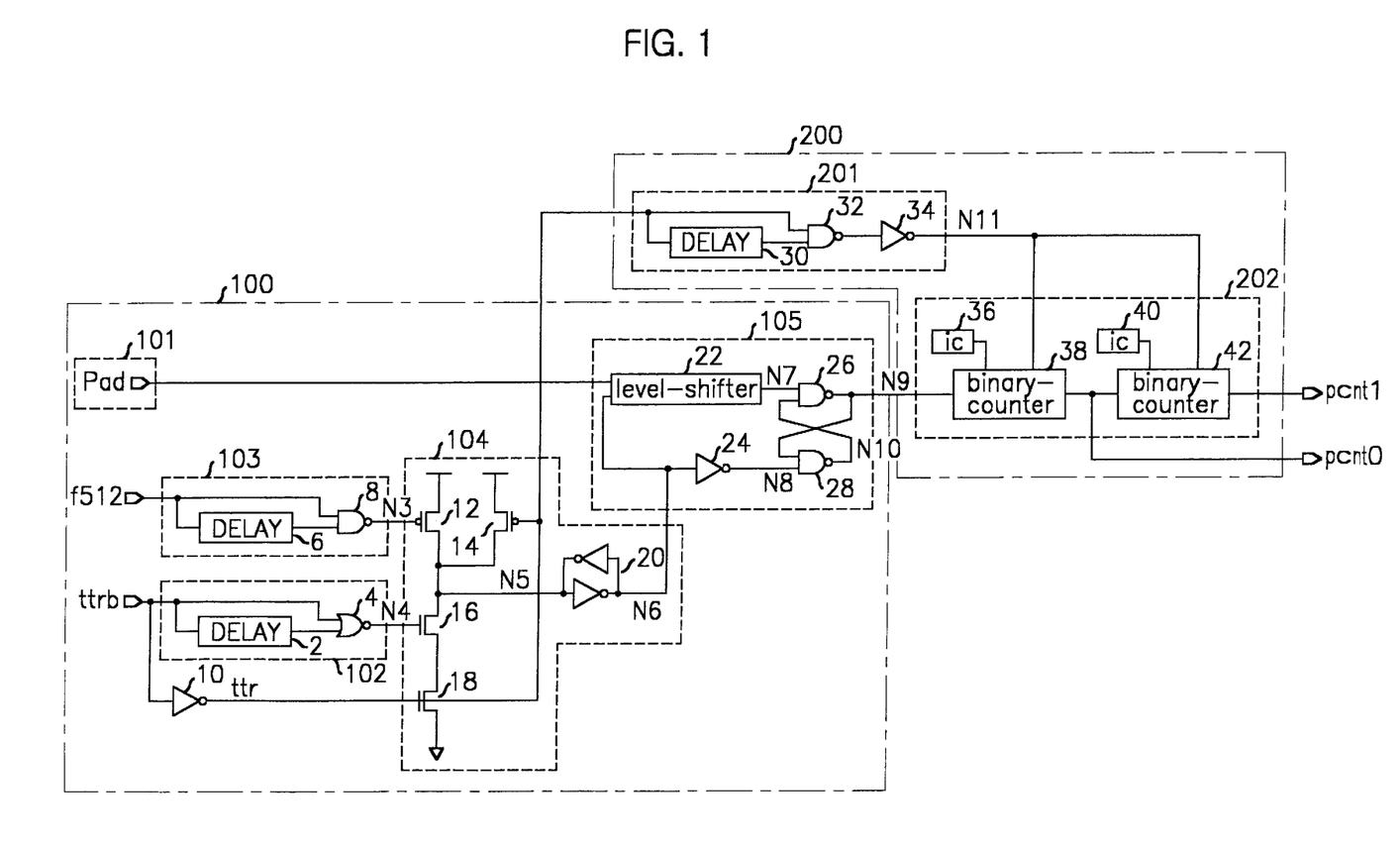
FIG. 1 is a schematic diagram depicting a single-input to multi-output converter in accordance with the present invention.

FIG. 1 depicts a single-input to multi-output converter in accordance with one embodiment of the present invention. The single-input multi-out converter includes an input buffering unit 100 and a pulse counting unit 200. The input buffering unit 100 converts level of a signal inputted to a single pulse pad 101 and outputs a level-converted signal responsive to a first and a second control signals ttrb and f512 shown in FIG. 2. The pulse counting unit 200 counts a number of output signals from the input buffering unit 100.

The input buffering unit 100 includes a pulse pad 101, a first pulse sensor 102, a second pulse sensor 103, a buffer 10, a comparator 104 and a pulse detector 105. The input buffering unit 100 receives an input signal having a plurality of pulses and outputs a signal having a number of pulses within a predetermined period in response to first and second control signals from external circuit.

The pulse pad 101 receives and feeds a signal from an external circuit (not shown) to the pulse counting unit 200.

Figure 2:
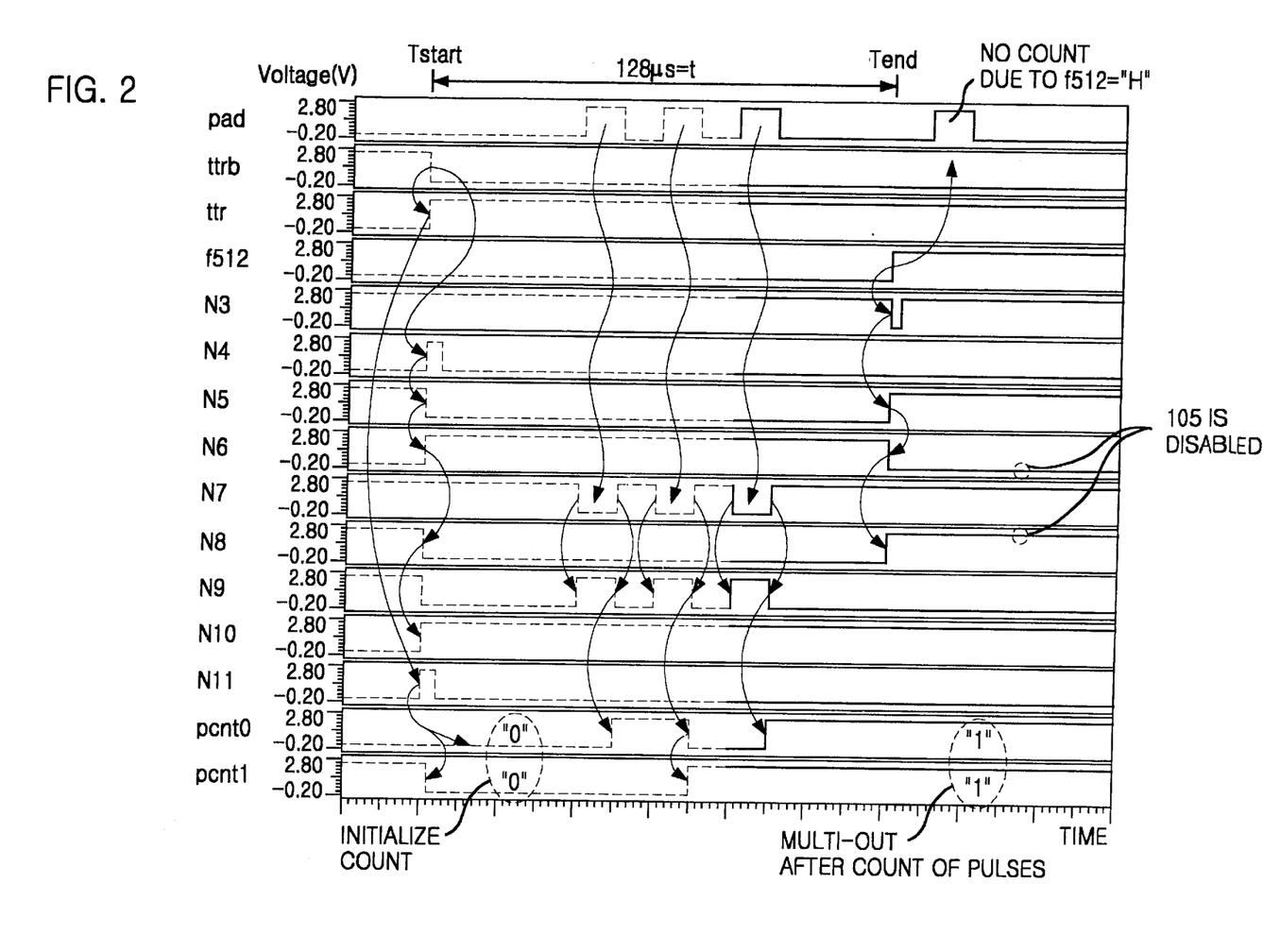
FIG. 2 is a timing diagram of FIG. 1.

The first pulse sensor 102 generates a first pulse representing a starting point of the predetermined period in response to the first control signal. The first pulse sensor 102 is a one-shot type sensor operating when a first control signal ttrb becomes a low level from a high level (N4 as shown in FIG. 2). The first pulse detector 102 provides an output node N4 of a NOR gate 4 with a first enable pulse during a predetermined delay time by a first delay 2 when the first control signal ttrb becomes low from high.

The second pulse sensor 103 generates a second pulse presenting a starting point of the predetermined period in response to the second control signal. The second pulse sensor 103 is a one-shot type sensor operating when a second control signal f512 becomes a high level from a low level. The second pulse detector 103 provides an output node N3 of a NAND gate a with a second enable pulse during a predetermined delay time by a second delay 6 when the second control signal f512 becomes a high level from a low level.

The buffer 10 generates an inverted signal ttr of the first control signal ttrb.

The comparator 104 compares the signals at output nodes N3 and N4 of the first and the second pulse sensor 102 and 103 with the invert signal ttr from the buffer 10 and stores the comparison results in a latch 20 in order to generate a third control signal representing the predetermined period and a fourth control signal representing the starting point of the predetermined period. The comparator 104 has two pairs of transistors and the latch 20. One consists of two NMOS transistors 16 and 18 located between a node N5 and a ground in serial, of which gates are respectively coupled to the node N4 and the output ttr of the buffer 10. The other consists of two PMOS transistors 12 and 14 located between the node N5 and a voltage source Vcc in parallel, of which gates is respectively coupled to the node N3 and the output ttr of the buffer 10. The inverter-type latch 20 is coupled between the nodes N5 and N6.

The pulse detector 105 generates an output signal representing the number of pulses of the input signal. The pulse detector 105 performs level-shifting of input signal from the pulse pad 101 and stores a level-shifted signal. The pulse detector 105 has a level shifter 22, an inverter 24 and a flip-flop 26 and 28. The level shifter 22 converts the input signal through the pulse pad 101 responsive to an output signal of the comparator 104. The inverter 24 inverts the output signal of the comparator 104. The flip-flop 26 and 28 is driven by output signals of the level shifter 22 and the inverter 24.

FIG. 2 is a timing diagram of FIG. 1. Hereinafter, operations of the input buffering unit 104 of FIG. 1 will be described in detail referring to FIG. 2.

As shown in FIG. 2, when the comparator 104 is pre-charged, that is, the first control signal ttrb is high, the inverted signal becomes a low level, the PMOS transistor 14 turns on and pre-charges the node N5 to a high level. If the first control signal ttrb is changed from a high level to a low level, the inverted signal ttr becomes a high level, the NMOS transistor 18 turns on and the PMOS transistor 14 turns off. At the same time, a pulse at the output node N4 of the first pulse sensor 102 becomes a high level and enables the node N5 pre-charged to a high level and the output node N6 of the latch 20 becomes a high level and enables the pulse detector 105.

When the pulse is inputted to the pulse detector 105 and the second control signal is changed from low to high, the pulse at the output node N3 of the second pulse sensor 103 becomes low, the PMOS transistor 12 turns on, the node N5 is pre-charged from low to high and then the pulse at the output node N6 of the latch 20 becomes low. If the pulse at the node N6 is low, the pulse detector 105 is disabled and the input signal through the pulse pad 101 is not transferred to the NAND-type latches 26 and 28. The level shifter 22 in the pulse detector 105 is a clock-controlled inverter. If the clock clk from the comparator 104 to the level-shifter 22 is a high level, the input pulse at the pulse pad is transferred to the node N7. If the clock clk is a low level, the node N7 is pre-charged as a high level.

Referring back to FIG. 1, the pulse counting unit 200 includes a two-bit binary counter 202 and a third pulse sensor 201 generating a control signal for initialization of the two-bit binary counting unit 202.

The third pulse sensor 201 has a delay 30 receiving the inverted signal ttr, a NAND gate 32 receiving the signal ttr and the output pulse of the delay 30, and an inverter 34 receiving the output pulse of the NAND gate 32. As mentioned above, when the signal ttr is changed from a low level to a high level a high pulse, is fed to an output node N11 of the third pulse sensor 201 for a certain time.

The two-bit binary counting unit 202 has a first binary counter 38 receiving the output signal of the input buffering unit 100 and outputting a first count signal pcnt0, and a second binary counter 42 receiving the first count signal pcnt0 and outputting a second count signal pcnt1. In this embodiment, incremental carries ics 36 and 40 are coupled to the ground. Then, the two-bit binary counters 38 and 42 are initialized. Here, the two-bit binary counters 38 and 42 can be coupled as a master-and-slave or a riffle-counter.

Each of the binary counter 38 and 42 is changed only when an input clock pcntinc inputted from the pulse detector to the binary counter becomes a low level from a high level. In another words, the binary counters 38 and 42 provide a final level signals corresponding to the number of input pulse at the node N9 after the nodes pcnt0 and pcnt1 are initialized (pcnt0=0, pcnt1=0). When the number of the input pulse increases from zero to three, the final level signal is counted as a binary number "00→01→10→11→00", that is, as a decimal number "0→1→2→3→0".

Figure 5:
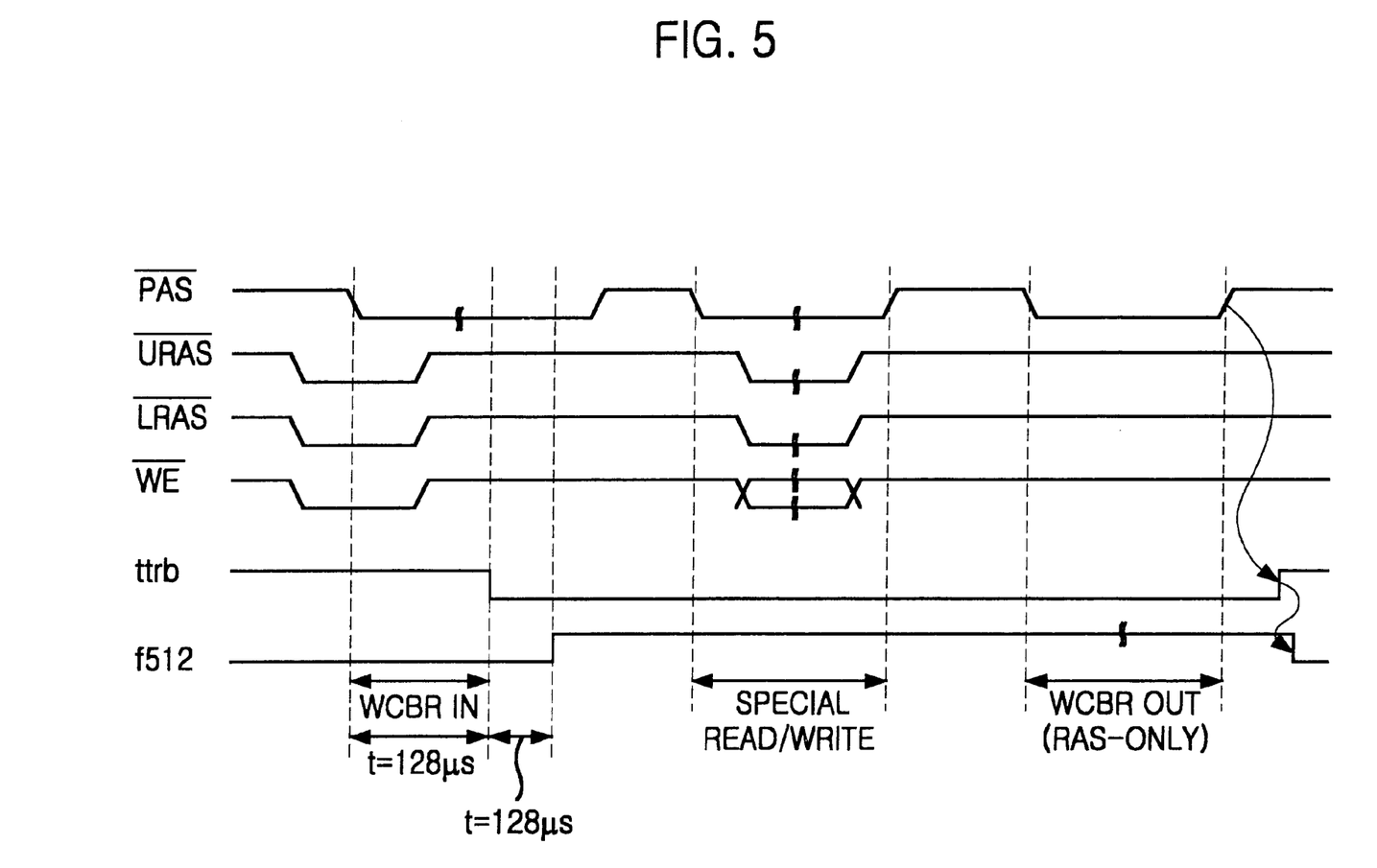

On the other hand, shown in FIG. 5, if WCBR-In (Parallel Test Mode) status is continued for 128 $\mu$s or more than (a start time of the WCBR-In status refers to 'Tstart') according to the specification of JEDEC standard, the first control signal ttrb is enabled from a high level to a low level. If RAS-Only or CBR Refresh status is continued for 128 $\mu$s or more than, the first control signal ttrb is disabled from a low level to a high level.

Also, as shown in FIG. 5, if WCBR-IN status is continued for 256 $\mu$s or more than, the second control signal f512 is enabled from low to high. The second control signal f512 is disabled from low to high through the RAS-Only or CBR Refresh signal, after the first control signal is disabled. In this embodiment, duration from time Tstart to time Tend is described as 128 $\mu$s.

Using the single-input to multi-output converter in accordance with the present invention, various kinds of commands, for example, commands used for Built-In-Self-Test can be generated, or operation modes of a certain circuit can be set by using binary outputs.

Figure 3:
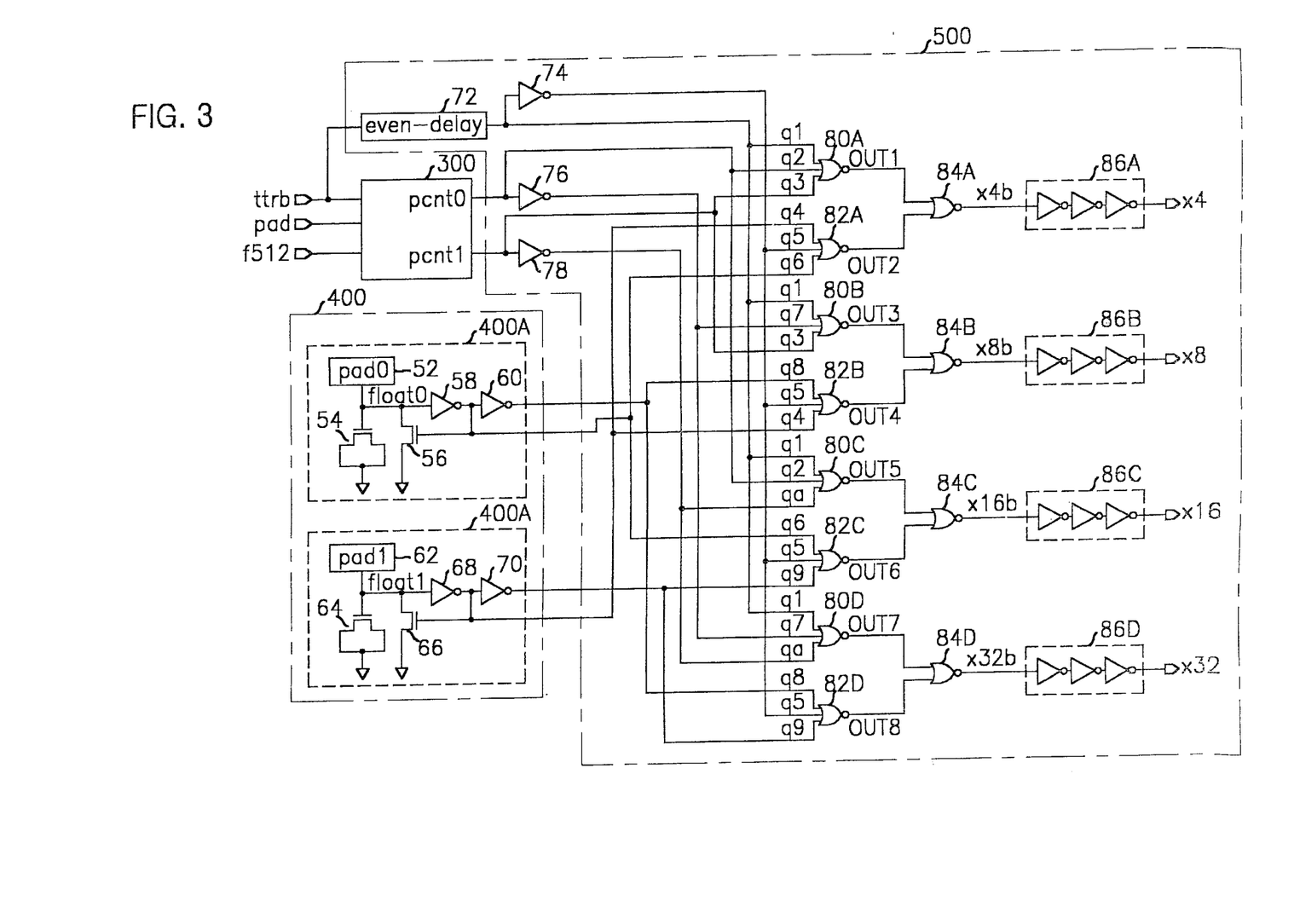
FIG. 3 is a schematic diagram showing a command generator utilizing the single-input multi-out converter in FIG. 1.

FIG. 3 is a schematic diagram showing a command generator utilizing the single-input to multi-output converter in FIG. 1.

The command generator comprises a single-input multi-out converting unit 300, an input signal detecting unit 400 and a command generating unit 500.

Figure 4:
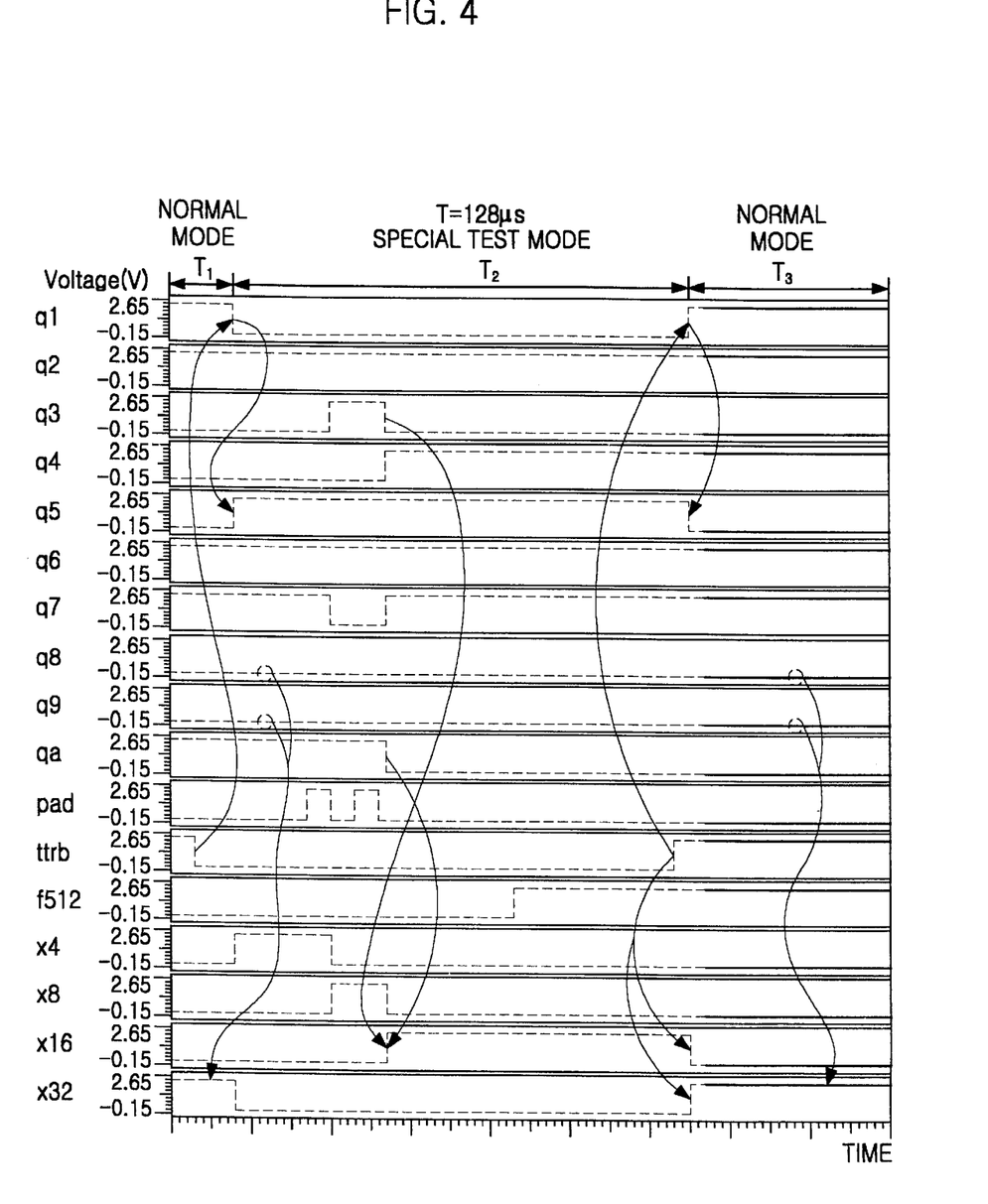
FIGS. 4 and 5 are timing diagrams illustrating timing relation between control signals of the command generator of FIG. 3.

As described above with reference with FIGS. 1 and 2, the single-input multi-out converting unit 300 counts pulses inputted to the pulse pad by using binary counters having the first control signal ttrb and the second control signal f512, and outputs counting results to the output nodes pcnt0 and pcnt1. Referring to FIG. 4, if two pulses are inputted to the pad, the output signal represents "2" as a decimal number. These relations are described in Table 1.

TABLE 1

| The number of pulses inputted to pad | output status of built-in counter | Status of final output |
| --- | --- | --- |
| 0 | pcnt0 = 0, pcnt1 = 0 | x4 = 1, others = 0 |
| 1 | pcnt0 = 1, pcnt1 = 0 | x8 = 1, others = 0 |
| 2 | pcnt0 = 0, pcnt1 = 1 | x16 = 1, others = 0 |
| 3 | pcnt0 = 1, pcnt1 = 1 | x32 = 1, others = 0 |

The input signal detecting unit 400 includes two pad voltage detector 400A and 400B.

The first pad voltage detector 400A has a pad pad0, a capacitor 54, MOS transistor 56 and buffers 58 and 60. The pad pad0 is coupled to the capacitor, the fed-back MOS transistor 56 and buffers 58 and 60. An output of the buffer 68 controls a gate of the fed-back MOS transistor 56.

The second pad voltage detector 400B has the similar configuration and operations as the first pad voltage detector 400A. Therefore, detailed description about the second pad voltage detector 400B will be skipped.

In this embodiment, the pads pad0 and pad1 will be bonding as binary state corresponding to the organization of products.

Status of the nodes q6, q8, q4 and q9 will be described in Table 2 when the first control signal ttrb is "1".

TABLE 2

| STATUS OF INPUT, PAD | NODE q6 | NODE q8 | NODE q4 | NODE q9 | STATUS OF FINAL OUTPUT |
| --- | --- | --- | --- | --- | --- |
| float0 = vss(0), float1 = vss(0) | 1 | 0 | 1 | 0 | x32 = 1, others = 0 |
| float0 = vss(1), float1 = vss(0) | 0 | 1 | 1 | 0 | x16 = 1, others = 0 |
| float0 = vss(0), float1 = vss(1) | 1 | 0 | 0 | 1 | x8 = 1, others = 0 |
| float0 = vss(1), float1 = vss(1) | 0 | 1 | 0 | 1 | x4 = 1, others = 0 |

The command generating unit 500 has an even delay 72 for delaying the first control signal ttrb. The delay signal is used for enabling the decoding part 80A to 86D. For discriminating operation modes, output of the node q5 prevents outputs of the pad voltage detector 400 from being decoded, the others are described in Tables 1 and 2.

Hereinafter, operation of the command generator will be described in more detail.

1) When Period of T1 (normal mode): ttrb=1, that is, q1=1 and q5=0, the status of the final output x4, x8, x16 and x32 are determined by output status of the pad voltage detecting unit 400.

As shown in FIG. 4, in this period, since only one input of the buffer 82D is "1" (high) and the others are "0" (low), that is, pad0=0, pad1=0, q8=0, q9=0 and q5=0, the output of the node OUT7 is "0" (low), and status of the output node x32b of buffer 84D is "1" (high). As a result, status of the final output node x32 is "1" (a high level).

2) When Period ot T2 (Test Mode) ttrb=0, that is, q1=0, q5=1, the status of the final output x4, x8, x16 and x32 are determined by output status of the single-input multi-out converting unit 300.

As shown in FIG. 4, in this period, if two pulses are inputted to the pad, one input q5 of the buffer 82C is "11" (high) and the others q2, qa and q1 are "0" (low). Accordingly, status of an output node OUT6 of the buffer 82C "0" and status of the final output node x16b is "1" (high). As a result, status of the final output node x16 is "1" (a high level).

When no pulse is inputted, only a status of the output node x4 is "1" (high). When one pulses are inputted, only a status of the output node x8 is "1" (high). As similar way, when three pulses are inputted, only a status of the output node x32 is "1" (high). In other words, a wanted operation mode can be selected by counting the number of the input pulses.

3) When Period of T3 (Normal Mode): ttrb=1, that is, q1=1 and q5=0, the mode is returned to the normal mode and operations of the command generator is the same as that in Period of T1.

As can be taught from the descriptions mentioned above, an operation mode can be selected by counting pulses, after generating control signals ttrb and f512. For explaining an example of application, generation of the control signal in 64M DRAM will be described Hereinafter.

For enabling the first control signal ttrb, Row Address Strobe (RAS)=0, Upper/Lower Column Address Strobe (U/L CAS)=0, Write Enable (WE)=0 are defined as a WCBR Mode enable (Parallel Test Mode) in JEDEC standard. If the WCBR status are continued for a predetermined time or more than (the predetermined time is counted by a built-in timer), in this embodiment, the predetermined time is 128 $\mu$s, the first control signal ttrb is enabled. If the WCBR status are continued for a predetermined time or more than (the predetermined time is counted by a built-in timer) after the first control signal ttrb is enabled, the second control signal is enabled.

Using the command generator in accordance with the present invention, functions mounted as bonding options before packaging can be pre-tested on the process wafer or PKG, thereby production time can be reduced.

The command generator counts the number of pulses of a input signal through a pad, that is, performs built-in self-test of the product, thereby product cost can be considerably reduced because of reduction of test time.

Although the preferred embodiments of the invention have been disclosed for illustrative purpose, those skilled in the art will appreciate that various modifications, additions and substitutions are possible, without departing from the scope and spirit of the invention as disclosed in accompanying claims.

What is claimed is:

1. A command generator for producing command signals in a predetermined period in a memory device, comprising:

a first control signal notifying a start point of the predetermined period, provided by an external circuit;

a second control signal notifying an ending point of the predetermined period, provided by an external circuit;

a converter for receiving the first and second control signals and an input signal having a plurality of pulses to generate binary data for the command signals within the predetermined period which is set by the first and second control signals; said converter comprising:

an input buffer, in response to the first and the second control signals, for receiving the input signal having a plurality of pulses, for shifting a level of the received input signal and for outputting an output signal having a number of pulses; and a pulse counter for counting the number of pulses in the output signal of the input buffer to generate the binary data representing the counted number.

2. The command generator as claimed in claim 1, wherein the input buffer includes:

a pad for receiving the input signal from the external circuit;

a first pulse sensor, in response to the first control signal, for generating a first pulse representing a starting point of the predetermined period;

a second pulse sensor, in response to the second control signal, for generating a second pulse representing a starting point of the predetermined period;

a comparator for comparing the first pulse with the second pulse to generate a third control signal representing the predetermined period and a fourth control signal representing the starting point of the predetermined period; and a pulse detector, in response to the third control signal, for generating the output signal representing the number of pulses of the input signal.

3. The apparatus as claimed in claim 2, wherein each of the first and the second pulse sensors has an one-shot type pulse sensor.

4. The apparatus as claimed in claim 2, wherein the first pulse sensor has a first delay for delaying the first control signal and a NOR gate receiving the first control signal or an output signal of the first delay.

5. The apparatus as claimed in claim 2, wherein the second pulse sensor has a second delay for delaying the second control signal and a NAND gate receiving the second control signal or an output signal of the second delay.

6. The apparatus as claimed in claim 2, wherein the pulse detector has a level-shifter for level-shifting the input signal through the pad responsive to the comparison result; and a flip-flop receiving an output signal of the level-shifter and the comparison result.

7. The apparatus as claimed in claim 1, wherein the pulse counter includes:

a binary counter receiving an output signal of the input buffer; and a third pulse sensor for generating a signal used for initializing the binary counter.

8. The apparatus as claimed in claim 7, wherein the third pulse sensor has a third delay for delaying the first control signal, a NAND gate receiving the first control signal and an output signal on the delay and an inverter for inverting an output signal of the NAND gate.

9. The command generator as claimed in claim 1, wherein the pulse counter includes:

a first binary counter for detecting transition of the output signal of the input buffer in response to the first control signal; and a second binary counter for detecting transition of an output signal of the first binary counter in response to the first control signal.

10. A command generator in a memory device, comprising:

a first control signal notifying a starting point of a test mode, provided by an external circuit;

a second control signal notifying an ending point of the test mode, provided by an external circuit;

a converter for receiving first and second control signals from the external circuit and an input signal for test of the memory device, the input signal having a plurality of pulses to generate binary data denoting a command;

an input detector for receiving binary input signals for normal operation and for outputting binary data; and a mode command generator for generating a command responsive to the binary data from said converter and said input detector.

11. The apparatus as claimed in claim 10, wherein said converter comprises:

an input buffer, in response to the first and the second control signals, for receiving the input signal having a plurality of pulses and outputting an output signal having a number of pulses within a predetermined period; and a pulse counter for counting the number of pulses in the output signal to generate binary data representing the counted number.

12. The apparatus as claimed in claim 11, wherein the input buffer includes:

a pad for receiving the input signal from the external circuit;

a first pulse sensor, in response to the first control signal, for generating a first pulse representing a starting point of the predetermined period;

a second pulse sensor, in response to the second control signal, for generating a second pulse representing a starting point of the predetermined period.

a comparator for comparing the first pulse with the second pulse to generate a third control signal representing the predetermined period and a fourth control signal representing the starting point of the predetermined period; and a pulse detector, in response to the third control signal, for generating the output signal representing the number of pulses of the input signal.

13. The apparatus as claimed in claim 12, wherein each of the first and the second pulse sensors has an one-shot type pulse sensor.

14. The apparatus as claimed in claim 12, wherein the first pulse sensor has a first delay for delaying the first control signal and a NOR gate receiving the first control signal or an output signal of the first delay.

15. The apparatus as claimed in claim 12, wherein the second pulse sensor has a second delay for delaying the second control signal and a NAND gate receiving the second control signal or an output signal of the second delay.

16. The apparatus as claimed in claim 12, wherein the pulse detector has a level-shifter for level-shifting the input signal through the pad responsive to the comparison result; and a flip-flop receiving an output signal of the level-shifter and the comparison result.

17. The apparatus as claimed in claim 11, wherein the pulse counter includes:

a binary counter receiving an output signal of the input buffer; and a third pulse sensor for generating a signal used for initializing the binary counter.

18. The apparatus as claimed in claim 17, wherein the third pulse sensor has a third delay for delaying the first control signal, a NAND gate receiving the first control signal and an output signal of the delay and an inverter for inverting an output signal of the NAND gate.

19. A memory device, comprising:
a command generator in a memory device, including:
- a converter for receiving first and second control signals from an external circuit and an input signal for test of the memory device, the input signal having a plurality of pulses to generate binary data denoting a command;
- an input detector for receiving binary input signals for normal operation and for outputting binary data denoting a command; and
- a mode command generator for generating a command to set an operation mode for a circuit responsive to the binary data from said converter and said input detector.

20. The memory device as claimed in claim 19, wherein the converter includes:
- an input buffer, in response to the first and the second control signals, for receiving the input signal having a plurality of pulses and outputting an output signal having a number of pulses within a predetermined period; and
- a pulse counter for counting the number of pulses in the output signal to generate binary data representing the counted number.

* * * * *